3,839,534

PROCESS FOR THE TREATMENT OF CONSUMED ETCHING SOLUTION

Akira Matsumoto, Fuji-shi, and Osamu Fujimoto, Shizuoka-shi, Japan, assignors to Tokai Electro-Chemical Co., Ltd., Tokyo, Japan No Drawing. Filed Sept. 18, 1969, Ser. No. 859,160
Int. Cl. C01g *3/10*
U.S. Cl. 423—43 3 Claims

ABSTRACT OF THE DISCLOSURE

A process for the treatment of consumed etching solution, in which compounds having a phosphoric acid radical and an alkali radical are added to the consumed etching solution containing salt of persulfuric acid or hydrogen peroxide acidified by sulphuric acid, either of the solution being used for dissolution of copper or copper alloy, whereby the pH value of the solution is regulated to about 4.5–6.5 and the dissolved copper being precipitated as insoluble copper salt so as to filter off and remove.

BACKGROUND OF THE INVENTION

(a) Field of the Invention

A process for the treatment of the etching solution which comprises precipitating copper dissolved in the consumed etching solution of persulfuric acid salt or of hydrogen peroxide acidified by sulfuric acid, either of the solution being used for dissolving copper or copper alloy, as insoluble copper salt from the said solution and filtering said precipitate.

(b) Description of the Prior Art

An aqueous solution of persulfate or that of hydrogen peroxide acidified by sulfuric acid has been used for dissolving copper or copper alloy. For example, in a production of a printing electric circuit, the surface of a copper foil laminated on a thin plastic or fibre plate is coated with a corrosion-proof agent (resist) so as to leave a useful circuit and is then subjected to an etching by using the aqueous solution of persulfate or of hydrogen peroxide acidified by sulfuric acid. Thus the resist-uncoated area of the copper foil is dissolved out, while the portion coated with the resist remains in the pattern of the planned circuit. In applying the aqueous solution of persulfate or of hydrogen peroxide acidfied by sulfuric acid for dissolving copper or copper alloy, said solution is usually used for dissolving copper or copper alloy until the velocity of copper dissolution decreases to such an extent that it may not be commercially profitable (normally 1$\mu$ of thickness per minute). The aqueous solution of persulfate or of hydrogen peroxide acidified by sulfuric acid is consequently disposed as the consumed etching solution.

An important matter through the disposition of the consumed etching solution is that the consumed etching solution normally contains 30,000–50,000 p.p.m. of copper which has strong toxicity and the other problems of pollution.

Therefore, it is necessary to remove completely the copper contained in the consumed etching solution before it is discharged.

It is also preferable to decrease the concentration of copper in the waste liquor to below 10 p.p.m. For example, in one of the tablets of Article 2 in the Enforcement Regulations of an Ordinance of Niigata Prefecture issued on Nov. 1, 1960 (No. 64), it is stipulated that the concentration of copper should not be exceeded by 10 p.p.m., and similarly in Article 4 of the regulations of Kanagawa Prefecture (No. 102) relating to a standardization of the public pollution issued on June 12, 1964, it is also stipulated that said concentration should not be exceeded by 5 p.p.m.

It has been known the processes for removing copper dissolved in the consumed etching solution, such as:

(a) a cooling method by utilizing a difference of solubilities of copper sulfate depending upon the temperature. The dissolved copper is recovered in the form of copper sulfate, when the consumed etching solution is cooled,
(b) a precipitation method by utilizing the ionization tendency. For example metal aluminium is added to the consumed etching solution so as to precipitate copper,
(c) an electrolytic method. The consumed etching solution is electrolyzed for depositing copper on the cathode.

However, in the cooling method it is difficult to decrease the concentration of the dissolved copper to below 10 g./l. even if the solution is cooled to 0° C. The precipitation method and electrolytic method are also difficult to operate and require a great deal of special techniques and it takes a long time of not shorter than 10 hours for completely removing the dissolved copper and further these methods are very expensive. Therefore, there has been a need to develop a method of disposition which has a feature of simple and easy to handle and the concentration of dissolved copper is not more than 10 p.p.m.

SUMMARY OF THE INVENTION

The present invention relates to a process for treating a consumed etching solution. More particularly it relates to a process for the treatment of consumed etching solution in which thhe compounds having a phosphoric acid radical and an alkali radical are added to the consumed etching solution for precipitating the dissolved copper to be filtered and removed, whereby the dissolved copper may be removed more simply and effectively comparing with the usual method now being practised.

It has now been found that when the pH of the consumed etching solution of persulfate or that of hydrogen peroxide acidified by sulfuric acid is controlled within the range of about 4.5–6.5 in the presence of a phosphoric acid ion and an alkali ion, the solubility of copper salt decreases remarkably and the dissolved copper is precipitated as an insoluble material, and then, by filtering and removing the precipitate thus produced, the concentration of the dissolved copper in the above-mentioned consumed etching solution can be decreased to not more than 10 p.p.m.

Even if pH is within the range of about 4.5–6.5 but the phosphoric acid ion is not present or *vice versa*, i.e., even if the phosphoric acid ion is present but pH is out of the range of about 4.5–6.5, the solubility of copper salt is still kept in high level and thus the dissolved copper cannot be removed to such an extent that the concentration of the copper becomes not more than 10 p.p.m.

Now, it has been found that 0.6 mol, preferably not less than 1.0 mol of phosphoric acid ion is required per 1 mol of the dissolved copper and the alkali ion is required in such an amount that the pH value of the consumed solution indicates 4.5–6.5, preferably 5.0–6.0 so as to achieve the object of the present invention.

In the operation of the present invention, the temperature is not a significant factor, but generally the range of about 10–70° C. is preferable.

The maximum amount of the phosphoric acid ion to be added, of course, varies more or less depending upon the kinds of compounds to be applied, but it is up to their saturated concentration. Practically, the range of up to about 5 mols per 1 mol of the dissolved copper may be advantageously used. When a greater amount of phosphoric acid ion is added, the effect of the present invention will not be influenced to a considerable extent.

The resulting copper salt is presumed to be the complex salt of a copper phosphate and an alkali sulfate, but the structure and molecular formula thereof have not yet been established.

As the compound for supplying phosphoric acid ion in accordance with the present invention, ortho-, meta-, pyro- and polyphosphoric acid ion are used and they are normally used in the form of an acid or an alkali salt thereof.

As the alkali ion, and alkali and alkaline earth metal ion and ammonium ion are used and they are normally used in the form of hydroxide or oxide. The phosphoric acid ion above described may be used separately or a mixture thereof, and the alkali ion may be also used separately or a mixture thereof.

The etching solution of persulfate used for dissolving copper and copper alloy may be ammonium, sodium, potassium, barium, lithium and strontium salt of persulfuric acid, but ammonium persulfate is the most suitable one for the present invention.

When the present invention is applied to the etching solution of persulfate which includes mercuric chloride, silver nitrate, rhodium sulfate, sulfuric acid, sodium chloride and the like in order to improve such as the dissolution speed of copper or copper alloy, the object of the present invention can be attained without any troubles.

Similarly the hydrogen peroxide etching solution acidified by sulfuric acid may contain silver nitrate, phenacetin, adipic acid, succinic acid and the like to improve the dissociation speed of copper or copper alloy.

A better understanding of the present invention and of its many advantages will be had by referring to the following specific Examples given by way of illustration.

Example 1

Six solutions were prepared by adding 1 liter of the consumed etching solution of ammonium persulfate to 35 g. (0.36 mol) of orthophosphoric acid and divided into six. To each of the solutions, sodium hydroxide was added for controlling the pH values of 3.5, 4.5, 5.0, 6.0, 6.5 and 7.0, respectively, and stood to make crystals, and then produced crystals were filtered by a centrifugal separator. The amounts of the filtrates and the amounts of copper remaining in the filtrates were as follows:

| PH | 3.5 | 4.5 | 5.0 | 6.0 | 6.5 | 7.0 |
|---|---|---|---|---|---|---|
| Amount of filtrates (ml.) | 740 | 745 | 745 | 745 | 745 | 740 |
| Amount of copper in the filtrates (p.p.m.) | 44.0 | 5.0 | 4.6 | 4.8 | 5.1 | 27.0 |

It is clear from the above table that the rate of the remaining copper is particularly small within the range of pH 4.5–6.5.

Example 2

Five solutions were prepared by adding 1 liter of the consumed etching solution of ammonium persulfate containing 32 g./l. (0.5 mol) of copper to 35 g. (0.36 mol) of orthophosphoric acid and to each of the solutions potassium hydroxide was added for regulating the pH value to 3.0, 4.5, 5.0, 6.5 and 7.5, respectively, and stood to make crystals. Then the resulting crystals were filtered by the centrifugal separator. The amounts of each filtrates and the amounts of copper in each filtrates were as follows:

| PH | 3.0 | 4.5 | 5.0 | 6.5 | 7.5 |
|---|---|---|---|---|---|
| Amount of filtrate (ml.) | 720 | 710 | 710 | 710 | 730 |
| Amount of copper in filtrate (p.p.m.) | 42.0 | 5.0 | 4.5 | 4.9 | 174.0 |

Example 3

To 1 liter of the consumed etching solution of ammonium persulfate containing 30 g./l. (0.47 mol) of copper, 58 g. (0.41 mol) of disodium phosphate was added and the pH value was regulated to 5.0 to precipitate crystal. The resulting crystal was filtered and removed by using the centrifugal separator and obtained 750 ml. of filtrate. The amount of copper remaining in the filtrate was 5.0 p.p.m.

Example 4

One litre of the consumed etching solution of ammonium persulfate which was used in Example 3 was put in 3 vessels separately, and 38 g. (0.47 mol) of metaphosphoric acid was added to the 1st vessel, 125 g. (0.47 mol) of sodium pyrophosphate to the 2nd vessel and 98 g. (about 0.28 mol) of polyphosphoric acid to the 3rd vessel. Then calcium hydroxide was added to each of the vessels and the pH values were regulated to 5.0 to percipitate crystals. The resulting crystals were filtered and separated by using the centrifugal separator. Analysis of the amount of remaining copper in each of the filtrates showed that they were all 4.9 p.p.m.

Example 5

One litre of the consumed etching solution of ammonium persulfate which was used in Example 3 was put in two vessels separately, and 47 g. (0.47 mol) of orthophosphoric acid was put in the 1st vessel and nothing was added to the 2nd vessel. Then both solutions were regulated to the pH value of 5.0 with sodium hydroxide to precipitate crystals. Thereafter, the resulting crystals were filtered and removed by a centrifugal separator and obtained 740 ml. and 750 ml. of filtrates, respectively. The amount of copper in the 1st vessel was 4.6 p.p.m. and in the 2nd vessel 3300 p.p.m.

Example 6

To one litre of the consumed etching solution of hydrogen peroxide acidified by sulfuric acid containing 30 g./l. (0.47 mol) of copper, 29 g. (0.3 mol) of orthophosphoric acid was added, and the pH value was regulated to 5.0 by adding sodium hydroxide thereto for precipitating crystals. Thereafter, the resulting crystals were filtered and removed with the centrifugal separator and obtained 720 ml. of filtrate. The amount of copper remaining in the filtrate was 5.0 p.p.m.

What is claimed is:

1. A process for the treatment of an acid consumed copper etching solution containing persulfuric acid salt or hydrogen peroxide acidified by sulfuric acid and being used for dissolving copper or copper alloy, which comprises adding:

(a) a phosphoric acid ion ($PO_4$—) supplying compound in an amount of from 0.6 mol per 1 mol of dissolved copper to a saturated concentration of said $PO_4$— supplying compound, and (b) an alkali, alkali earth metal or ammonium compound to the consumed etching solution so as to regulate the pH value of said solution to 4.5–6.5, and filtering a resulting crystal of copper salt, whereby obtaining a waste solution containing not more than 10 p.p.m. of dissolved copper.

2. A process according to the claim 1, which comprises using at least one compound selected from the group consisting of orthophosphoric acid, metaphosphoric acid, pyrophosphoric acid, polyphosphoric acid and alkali salt thereof as the phosphoric acid ion supplying compound.

3. A process according to the claim 1, in which the phosphoric acid ion is added in an amount of not less than 0.6 mol per 1 mol of the dissolved copper to the saturation concentration of said phosphoric acid ion compound.

(References on following page)

References Cited

UNITED STATES PATENTS

| | | | |
|---|---|---|---|
| 3,201,194 | 8/1965 | Salutsky | 23—105 |
| 3,400,027 | 9/1968 | Radimer et al. | 156—19 |
| 3,311,447 | 3/1967 | Stuart | 23—105 |

OTHER REFERENCES

Cloutier "Contribution to the Study of the Precipitation of basic salts of lead and of Metallic Phosphates, Annales de Chimie (10) 1933 pp. 47, 52–55 cited.

Fujiwara et al., "Synthesis and Properties of the Phosphates of Heavy Metals," cited as an abstract from Chemical Abstracts vol. 55, 16887g.

GEORGE F. LESMES, Primary Examiner

R. V. ROCHE, Assistant Examiner

U.S. Cl. X.R.

423—305; 156—19